United States Patent
Brennan et al.

(10) Patent No.: US 7,436,281 B2
(45) Date of Patent: Oct. 14, 2008

(54) METHOD TO IMPROVE INDUCTANCE WITH A HIGH-PERMEABILITY SLOTTED PLATE CORE IN AN INTEGRATED CIRCUIT

(75) Inventors: Kenneth D. Brennan, Plano, TX (US); Satyavolu S. Papa Rao, Garland, TX (US); Byron Williams, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 204 days.

(21) Appl. No.: 10/909,046

(22) Filed: Jul. 30, 2004

(65) Prior Publication Data

US 2006/0022787 A1 Feb. 2, 2006

(51) Int. Cl.
*H01F 5/00* (2006.01)

(52) U.S. Cl. .................................... 336/200

(58) Field of Classification Search ............ 336/200
See application file for complete search history.

(56) References Cited

U.S. PATENT DOCUMENTS 5,583,474 A * 12/1996 Mizoguchi et al. ............ 336/83
5,915,188 A    6/1999 Ramakrishnan et al.
6,114,937 A *  9/2000 Burghartz et al. ........... 336/200
6,600,208 B2   7/2003 Brennan et al.
2002/0097129 A1* 7/2002 Johnson ...................... 336/200
2003/0091846 A1 5/2003 Kobayashi et al.
2003/0175411 A1 9/2003 Kodas et al.
2004/0263310 A1* 12/2004 Ding et al. .................. 336/223

* cited by examiner

*Primary Examiner*—Elvin Enad
*Assistant Examiner*—Joselito Baisa
(74) *Attorney, Agent, or Firm*—Frederick J. Telecky, Jr.; Wade J. Brady, III

(57) ABSTRACT

An inductor structure (102) formed in an integrated circuit (100) is disclosed, and includes a first isolation layer (106) and a first core plate (104) disposed over or within the first isolation layer (106, 114). The first core plate (104) includes a plurality of electrically coupled conductive traces composed of a conductive ferromagnetic material layer. A second isolation layer (108) overlies the first isolation layer and an inductor coil (102) composed of a conductive material layer (118) is formed within the second isolation layer (108). Another core plate may be formed over the coil. The one or more core plates increase an inductance (L) of the inductor coil (102).

18 Claims, 7 Drawing Sheets

(SECT A-A)

(SECT B-B)

(SECT C-C)

(SECT D-D)

(SECT E-E)

(SECT F-F)

METHOD TO IMPROVE INDUCTANCE WITH A HIGH-PERMEABILITY SLOTTED PLATE CORE IN AN INTEGRATED CIRCUIT

FIELD OF INVENTION

The present invention relates generally to semiconductor devices and more particularly to an improved inductor formed together with one or more high permeability conductive core plates suitable for use as a plate of a planar capacitor in the fabrication of integrated circuit devices.

BACKGROUND OF THE INVENTION

In the manufacture of semiconductor products such as integrated circuits, individual electrical devices are formed on or in a semiconductor substrate, and are thereafter interconnected to form circuits. Interconnection of these devices within an integrated circuit is typically accomplished by forming a multi-level interconnect network in layers formed over the electrical devices, by which the device active elements are connected to other devices to create the desired circuits. Individual wiring layers within the multi-level network are formed by depositing an insulating or dielectric material layer such as $SiO_2$ over the discrete devices or over a previous interconnect layer, and patterning and etching contact openings such as vias. A second pattern and etch defines trenches, the wiring between vias. Conductive material, such as copper is then deposited into the vias and trenches and planarized to form the next level of interconnect. Dielectric or insulating material then deposited over the patterned conductive layer, and the process may be repeated any number of times using additional wiring levels laid out over additional dielectric layers with conductive vias therebetween to form the multi-level interconnect network.

Integrated circuits used in radio frequency (RF) applications may contain inductors and capacitors in addition to the common use of transistors, diodes and resistors. Such integrated inductors and capacitors may be formed in the multi-level networks of the interconnect layers.

As device densities and operational speeds continue to increase and device scaling proceeds into the deep sub-micron regime, reduction of inductor and capacitor sizes in integrated circuits is also highly desired as these devices may require significant area within an integrated circuit to achieve the desired inductance (L) or capacitance (C). In addition, the location and structure of such passive devices may be particularly sensitive to stray capacitive coupling and noise, particularly when used as components of high input impedance or high gain circuits, high speed switching circuits, or RF integrated circuits.

Some prior art integrated inductor or capacitor designs use an associated solid conductive plate or shield layer. Such solid conductive layers may tend to develop eddy currents within the plates that needlessly consume power and degrade the efficiency of the device.

Accordingly, it is desirable to fabricate an improved inductor integrated within a semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to an improved inductor structure having a high-permeability core plate material (e.g., cobalt, nickel, tantalum, a TiN/Co/TiN stack, a TaN/Co stack, or another high-permeability ferromagnetic core material) associated therewith that may double as a capacitor plate integrated within a semiconductor device during the fabrication of integrated circuit devices. The device of the present invention effectively improves inductance by using one or more high-permeability ferromagnetic material core plates in close proximity to the inductor coil. The inductor further mitigates eddy currents within the core plate by use of slotted or spaced apart traces in each plate. Capacitive coupling with adjacent circuit elements or interconnects and a variety of noise sources are further reduced or avoided by the use of these conductive core plates.

In one aspect of the present invention, the inductor comprises an inductor coil formed of a conductive material (e.g., copper, aluminum, tantalum, or a TaN/Al stack) in a trench within an insulative layer (e.g., TaN, SiO2, an etch-stop material, SiN, SiC, SiC:H, or another insulative or dielectric material) along with, or adjacent to the high-permeability core plate layer.

In another aspect of the invention, the isolation layers between the conductive portions of the inductor structure comprise one of an OSG, FSG, TEOS, a low-k dielectric material, or an ultra low-k dielectric material. In one or more aspects of the invention, the inductor structure may be fabricated, for example, between one or more multi-level interconnect metal layers of a semiconductor device, above the metal layers, or within one or more of the protective overcoat (e.g., PO, PO2) layers.

In another preferred aspect of the present invention, since the ferromagnetic core plate material comprises a conductor, the plate may also be utilized as one plate of a capacitor associated with the integrated circuit. In another aspect, the capacitor plate/core plate may be electrically connected in series with the inductor coil to form a series L-C circuit, or alternately, may be wired separately.

In yet another preferred aspect of the invention, the conductive ferromagnetic core plate comprises slotted or spaced apart traces when formed in a planar configuration to mitigate eddy current losses, and to limit power consumption in the device. Alternately, the inductor coil may be formed in the trench overlying a layer of the high-permeability core material and etched, for example, to form spaces or slots between the turns of the coil. In this way, eddy currents are still avoided while the inductor coil and the core plate structures remain electrically continuous along the length of the coil.

In still another aspect of the present invention, the conductive core plate(s) provide a shield to the inductor to sufficiently shield the device from noise to provide more predictable inductor performance.

In a method aspect of the present invention, the inductor structure may be formed, for example, overlying a semiconductor substrate, and a first isolation layer (e.g., TaN, SiO2, an etch-stop material, SiN, SiC, SiC:H, or another insulative or dielectric material) disposed therebetween. Trenches are then formed within the first isolation layer, a core plate comprising a conductive ferromagnetic material layer (e.g., cobalt, nickel, tantalum, a TiN/Co/TiN stack, a TaN/Co stack, or another high-permeability ferromagnetic core material) is then disposed within the trenches, followed by a second isolation layer over the core plate. An inductor coil comprising a conductive material layer (e.g., copper, aluminum, tantalum, or a TaN/Al stack) is then disposed within the trenches associated with the second isolation layer and overlying the core plate. A portion of the conductive material layer, the core plate, and isolation layers is removed to pattern the turns of the inductor coil and provide isolation spaces between the electrically conductive turns of the inductor coil and the ferromagnetic core plate layer. Optionally, a third isolation layer or protective overcoat layer (e.g., PO, PO2) may be added overlying the inductor coil and the core plate.

The first and third isolation layers (e.g., an OSG, FSG, TEOS, a low-k dielectric material, or an ultra low-k insulative materials) are disposed above and below the inductor to electrically isolate the inductor between, for example, the interconnect metal layers, ILD, IMD, or PO, or PO2 layers.

In yet another aspect of the invention a second core plate may be formed overlying the third isolation layer to provide additional inductance permeability. In still another aspect of the invention, the traces of the first and second core plates of the inductor structure are aligned orthogonal to each other.

Electrical connections to the inductor structure are provided by conductive vias attached to the ends of the inductor coil extending through respective openings in the isolation layers and through slots or other such openings in the core plates. Such slots in the shield layers also mitigate eddy current losses in the core plates or capacitor plate that would otherwise develop in solid or continuous conductive layers.

Beneficially, the invention provides improved inductance and more predictable integrated inductor performance while mitigating eddy currents and utilizing a ferromagnetic material (e.g., cobalt) currently used in most standard semiconductor processes.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
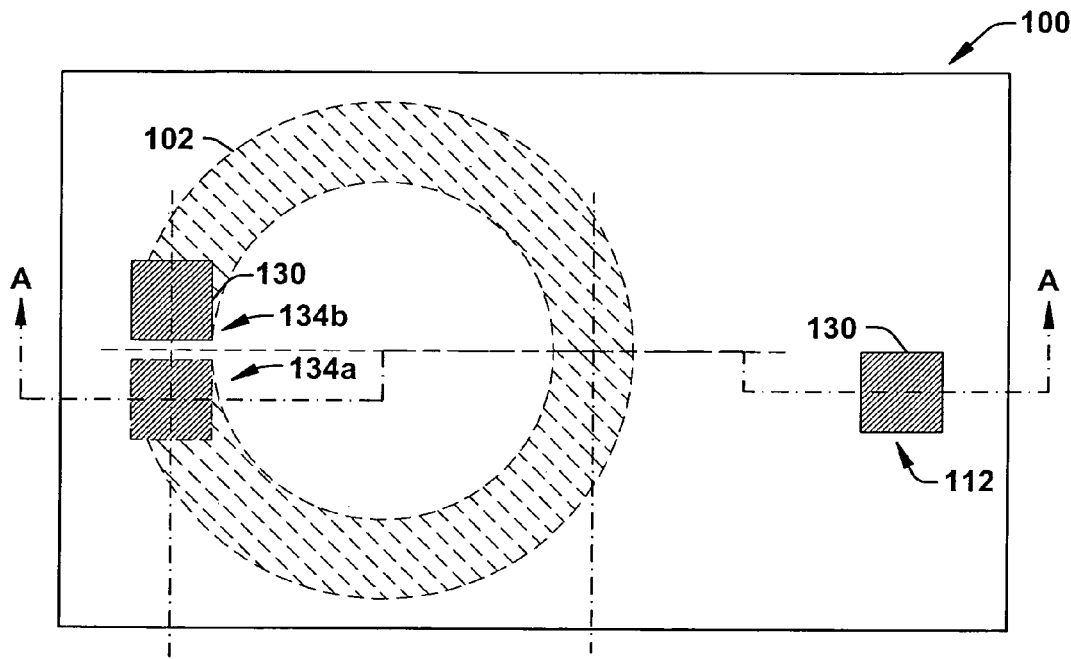
FIG. 1A is a top view illustrating an exemplary integrated inductor structure having a single turn coil disposed within isolation layers of a semiconductor device in accordance with an aspect of the present invention.

The present invention will now be described with reference to the attached drawings, wherein like reference numerals are used to refer to like elements throughout. The invention relates to an integrated inductor structure formed together with, or in close proximity to a slotted high-permeability core plate during interconnect metal level processing of integrated circuits and other devices. One or more implementations of the invention are hereinafter illustrated and described in the context of the fabrication of the integrated inductor structure and the core plate in semiconductor devices, utilizing ferromagnetic material layers, etch-stop layers, isolation layers, tantalum, and other interconnect metal or conductive layers. However, it will be appreciated by those skilled in the art, that the invention is not limited to the exemplary implementations illustrated and described hereinafter. In particular, a variety of such materials may be used to form the structures discussed.

As previously indicated, because of increasing device densities and the relatively large size of passive components such as inductors and capacitors in integrated circuits, even incremental reductions in the size of these devices is becoming increasingly desirable. The current challenge addressed in the present invention, is to fabricate higher inductance L and capacitance C devices in ever smaller dimensions. To this end, several methodologies are utilized in the context of the present invention.

As inductance L is proportional to permeability, one such approach incorporates positioning a conductive high-permeability core plate in close proximity to the inductor coil to increase the inductance of the device. In one aspect of the invention, the core plate comprises a high-permeability ferromagnetic material (e.g., cobalt, nickel, tantalum, a TiN/Co/TiN stack, a TaN/Co stack, or another high-permeability ferromagnetic core material) that is conductive to provide shielding and double as a capacitor plate, and slotted to avoid eddy current losses. The present invention presents two such implementations of the core plate approach; a planar core plate placed close to the inductor coil, and a contoured core plate layer formed together with and around the inductor coil. Each approach has certain advantages as will be discussed hereinafter in connection with the figures.

The present invention provides several other distinct benefits over prior art structures where space and size are important. The use of a conductive material for the core plate, whether in the form of a planar plate, or a contoured layer, offers more efficient space utilization by providing at least one plate of a capacitor in the same space. In another variation of the implementation, if two such conductive core plates are utilized, for example, one plate above and one below the inductor, a complete capacitor, or alternately, two plates of two independent capacitors would be provided. Other advantages of the conductive ferromagnetic core plate concept over that of a prior art insulative ferromagnetic material layer, are that the conductive core material provides a higher permeability and a more effective shield layer to electromagnetic (EM) interference, various noise sources, and stray capacitive coupling.

A further advantage is offered by the approach of the present invention, wherein a ferromagnetic material (e.g., cobalt) currently used in some semiconductor processes may be utilized. Thus, compared to the prior art, specialized materials or extra process steps are not required in the fabrication of the integrated inductor structure in at least one example of the present invention. This is due, in part, because in one example, a process comprises cobalt for the silicide process, and copper and aluminum diffusion barriers formed between the metal and the dielectric layers as well as between the metal layers and the silicon substrate. Such barriers are typically formed using conductive compounds of transition metals such as tantalum, tantalum nitride, tantalum silicon nitride, PVD tantalum, titanium nitride, and tungsten nitride as well as the various transition metals themselves. Insulators such as silicon nitride and silicon oxynitride have also been used as barrier materials between copper metallurgy and insulative layers. More recently, silicon carbide (SiC) has been used as a copper diffusion barrier material, as well an etch-stop layer and a hard mask used during trench and/or via cavity formation.

RC delay times associated with the metal interconnect layers may also be improved by utilizing new porous low dielectric constant (low-k) dielectric materials formed between the wiring metal lines, in order to reduce the capacitance therebetween and consequently to increase circuit speed. Examples of low-k dielectric materials include the spin-on-glasses (SOGs), as well as organic and quasi-organic materials such as polysilsesquioxanes, fluorinated silica glasses (FSGs) and fluorinated polyarylene ethers. Organic, non silicaceous materials such as the fluorinated polyarylene ethers are seeing an increased usage in semiconductor processing technology because of their favorable dielectric characteristics and ease of application. Other low-k insulator materials include organo-silicate-glasses (OSGs), and ultra low-k dielectrics. OSG materials, for example, may be low density silicate glasses to which alkyl groups have been added to achieve a low-k dielectric characteristic.

FIG. 1A, for example, illustrates a top view of an exemplary integrated inductor structure L having a single turn coil disposed within isolation layers of a semiconductor device 100 in accordance with an aspect of the present invention.

Figure 1B:
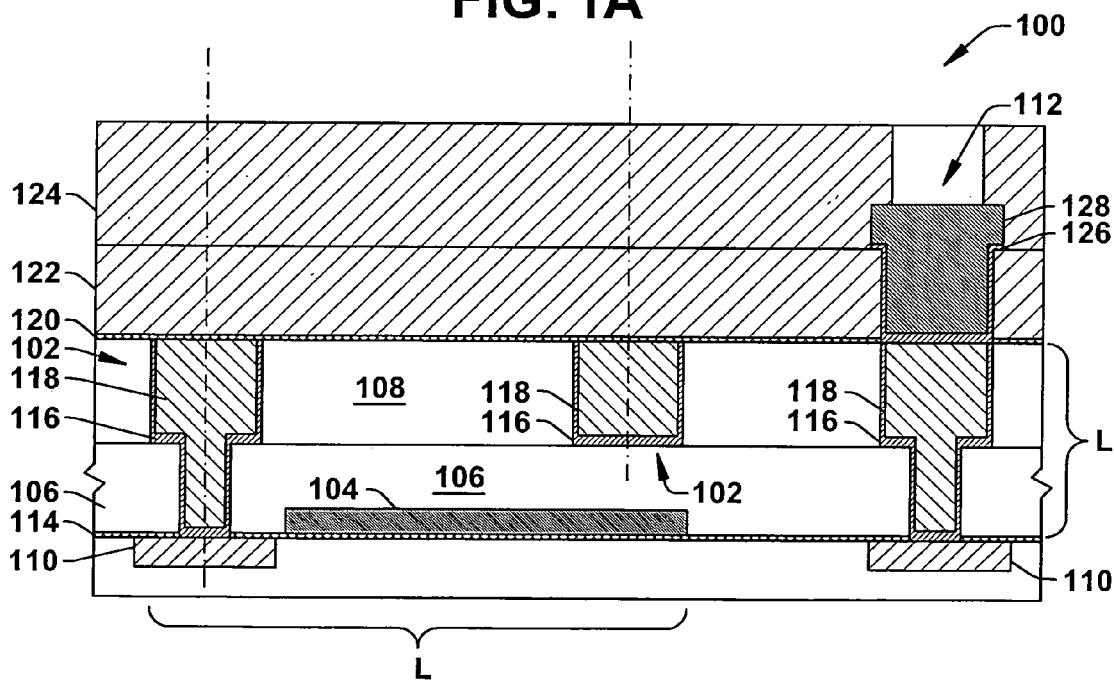
FIG. 1B is a cross-sectional side view taken along section line AA of FIG. 1A, illustrating an exemplary integrated inductor structure of the single turn coil and a ferromagnetic material core plate disposed below the inductor coil within isolation layers of the semiconductor device of FIG. 1A.

FIG. 1B is a cross-sectional side view taken along section line AA of FIG. 1A, illustrating the exemplary integrated inductor structure L of the semiconductor device 100 of FIG. 1A. In the semiconductor device 100, the inductor structure L comprises the single turn coil 102 and a ferromagnetic material core plate 104 disposed below the inductor coil 102 within the isolation layers, for example, within interlevel dielectric layer ILD 106 (a first isolation layer) and the top inter-metal dielectric layer top IMD 108 (a second isolation layer).

Preferably, the inductor structure L of device 100, for example, is formed above a semiconductor substrate in or above the copper metal interconnect layers such as a copper Mx-1 layer 110, wherein the bond pads 110 for the inductor L and an unrelated via structure 112 are shown. An etch-stop layer 114 (e.g., TiN, SiC, SiC:N, or another etch stop material) may then be formed overlying the copper bond pads of the Mx-1 interconnect layer 110, followed by the core plate 104 comprising a conductive ferromagnetic material layer (e.g., cobalt, nickel, tantalum, a TiN/Co/TiN stack, a TaN/Co stack, or another high-permeability ferromagnetic core material). The ferromagnetic core plate layer 104, in one example, is patterned to form slots or other spaced apart traces in the conductive plate, which are mutually electrically conductive to each other to avoid eddy current losses in the plate.

Isolation layers ILD 106 and TOP IMD 108 formed over the core plate 104 and the etch stop layer 114, may comprise insulating or dielectric materials (e.g., TaN, SiO$_2$, an etch-stop material, SiN, SiC, SiC:H, or another insulating material). Trenches are then formed within the isolation layers 106 and 108 (e.g., consistent with a dual damascene process), wherein a diffusion barrier layer 116 (e.g., TaN, TiN) and a conductive material layer 118 (e.g., copper, aluminum, tantalum, or a TaN/Al stack) is disposed within the trenches to form the inductor coil 102. The structure may then receive a CMP operation for planarization to further define the shape and turns of the inductor coil 102 and to electrically isolate the electrically conductive turns of the inductor coil 102. Because etch stop layer 114 is also insulative, it may be considered a first isolation layer or a part of the first isolation layer 106. In such case, the core plate 104 may be considered disposed over an upper surface of, or within, the first insulation layer.

Thus, an inductor coil comprising a conductive material is disposed and formed within the trenches of the second isolation layer 108 overlying the first isolation layer 106 and the core plate 104. Optionally, the formation of the inductor structure L may be followed by another deposition of an etch-stop material layer 120 and one or more protective overcoat layers, for example, protective overcoat layer PO 122, and protective overcoat layer PO2 124 (a third isolation layer) overlying the inductor coil 102 and the core plate 104.

Vias, such as 112 comprising additional diffusion barrier layers 126 and conductive interconnects 128 may be formed within the protective overcoat layers PO 122, and PO2 124 to interconnect to the underlying circuit elements and structures. Bond pads 130 may be then formed overlying the via structures or other openings for electrical connection to one or more terminals 134 of the inductor 102. In the exemplary device 100 of FIGS. 1A and 1B, one terminal 134a of the inductor coil 102 connects to the Mx-1 copper layer 110 under the inductor L, and the other terminal 134b connects to a bond pad 130 above inductor L.

Figure 2A:
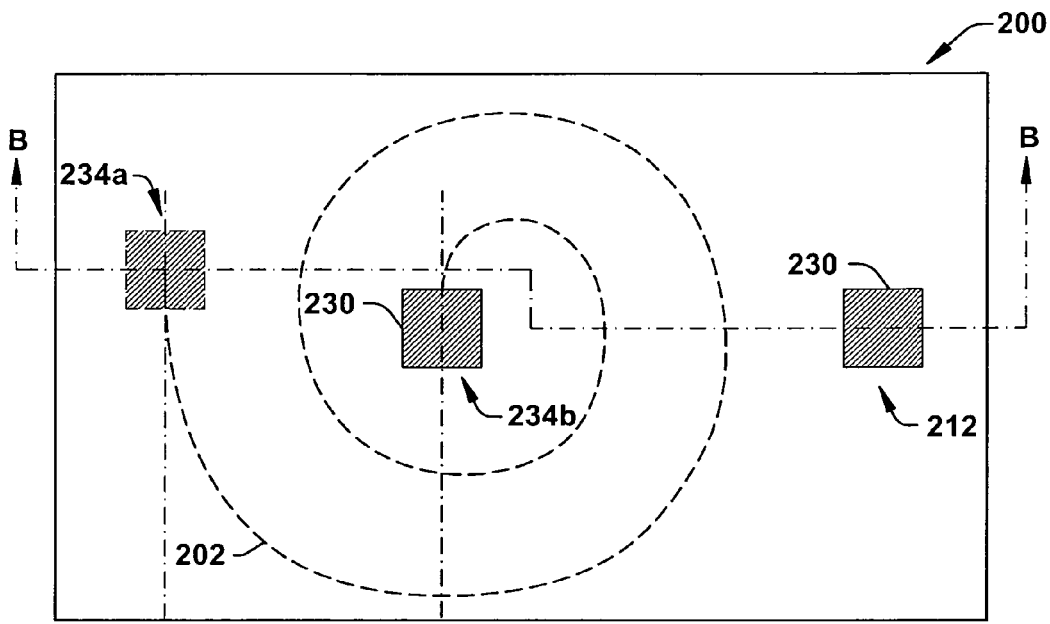
FIG. 2A is a simplified top view illustrating an exemplary integrated inductor structure having a two turn coil disposed within isolation layers of a semiconductor device in accordance with an aspect of the present invention.

FIG. 2A illustrates a top view of an exemplary integrated inductor structure L having a two turn coil disposed within isolation layers of a semiconductor device 200 in accordance with another aspect of the present invention.

Figure 2B:
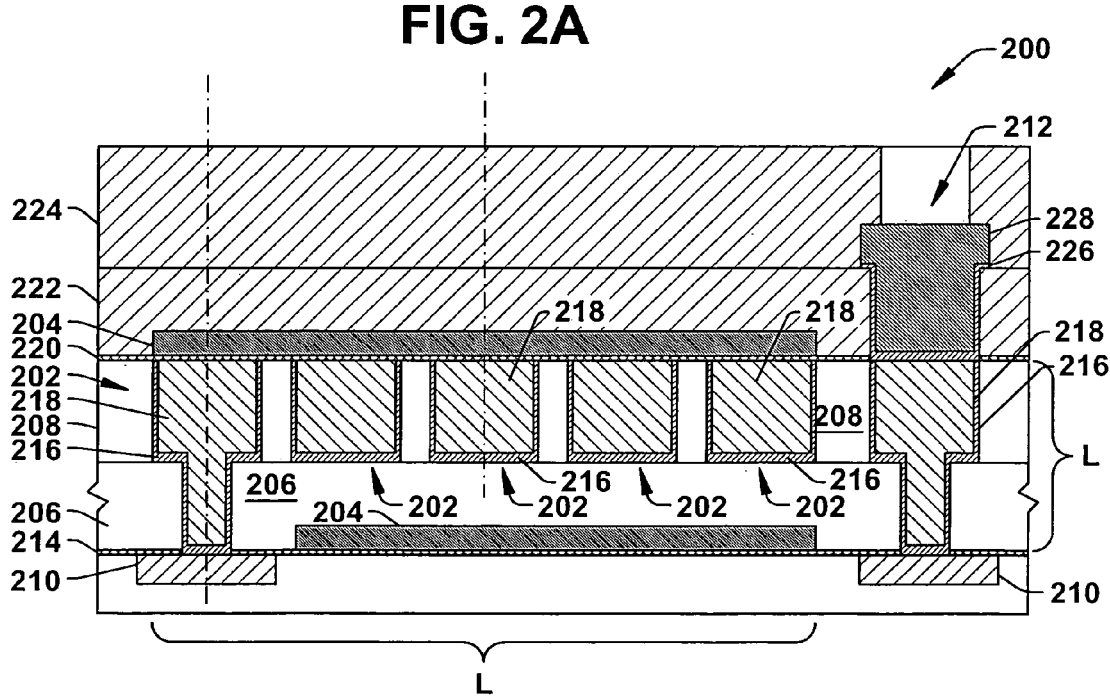
FIG. 2B is a cross-sectional side view taken along section line BB of FIG. 2A, illustrating an exemplary integrated inductor structure of the two turn coil and a ferromagnetic material core plate disposed above and below the inductor coil within isolation layers of the semiconductor device of FIG. 2A.

FIG. 2B is a cross-sectional side view taken along section line BB of FIG. 2A, illustrating the exemplary integrated inductor structure L of the semiconductor device 200 of FIG. 2A. The inductor structure L of FIGS. 2A and 2B is similar to that of the inductor of FIGS. 1A and 1B, and as such need not be fully described again for the sake of brevity except where noted. In the semiconductor device 200, the inductor structure L comprises the two turn coil 202 and a ferromagnetic material core plate 204 disposed above and below the inductor coil 202 within the isolation layers, for example, within interlevel dielectric layer ILD 206 (a first isolation layer) and over a top inter-metal dielectric layer TOP IMD 208 (a second isolation layer).

Again, the inductor structure L of device 200, for example, is formed above a semiconductor substrate in or above the copper metal interconnect layers such as a copper Mx-1 layer 210, wherein bond pads for the inductor L and an unrelated via structure 212 are shown. An etch-stop layer 214 (e.g., TiN, Sic, SiC:N, or another etch stop material) may then be formed overlying the copper bond pads of the Mx-1 interconnect layer 210, followed by a core plate 204 comprising a conductive ferromagnetic material layer (e.g., cobalt, nickel, tantalum, a TiN/Co/TiN stack, a TaN/Co stack, or another high-permeability ferromagnetic core material). Each ferromagnetic core plate layer 204, in one example, is patterned to form slots or other spaced apart traces in the conductive plate, which are mutually electrically conductive to each other in order to avoid eddy current losses in the plate.

Isolation layers ILD 206 and TOP IMD 208 formed over the lower core plate 204 and the etch stop layer 214, may comprise insulating or dielectric materials (e.g., TaN, SiO2, an etch-stop material, SiN, SiC, SiC:H, or another insulating material). Trenches are then formed within the isolation layers 206 and 208, wherein a diffusion barrier layer 216 (e.g., TaN, TiN) and a conductive material layer 218 (e.g., copper, aluminum, tantalum, or a TaN/Al stack) is disposed within the trenches to form the inductor coil 202. The structure may then receive a CMP operation to further define the shape and turns of the inductor coil 202 and to provide isolation spaces between the electrically conductive turns of the inductor coil 202.

Thus, an inductor coil comprising a conductive material is disposed and formed within the trenches of the second isolation layer 208 overlying the first isolation layer 206 and the core plate 204. Optionally, as shown, the formation of the inductor structure L may be followed by another deposition of an etch-stop material layer 220, a second or upper ferromagnetic core plate 204, and one or more protective overcoat layers, for example, protective overcoat layer PO 222, and protective overcoat layer PO2 224 (a third isolation layer) overlying the inductor coil 202 and the core plate 204.

Vias, such as 212 comprising additional diffusion barrier layers 226 and conductive interconnects 228 may be formed within the protective overcoat layers PO 222, and PO2 224 to interconnect to the underlying circuit elements and structures. Bond pads 230 may be then formed overlying the via structures or other openings for electrical connection to one or more terminals 234 of the inductor 202. In the exemplary device 200 of FIGS. 2A and 2B, one terminal 234a of the inductor coil 202 connects to the Mx-1 copper layer 210 under the inductor L, and the other terminal 234b connects to a bond pad 230 above inductor L.

Figure 3A:
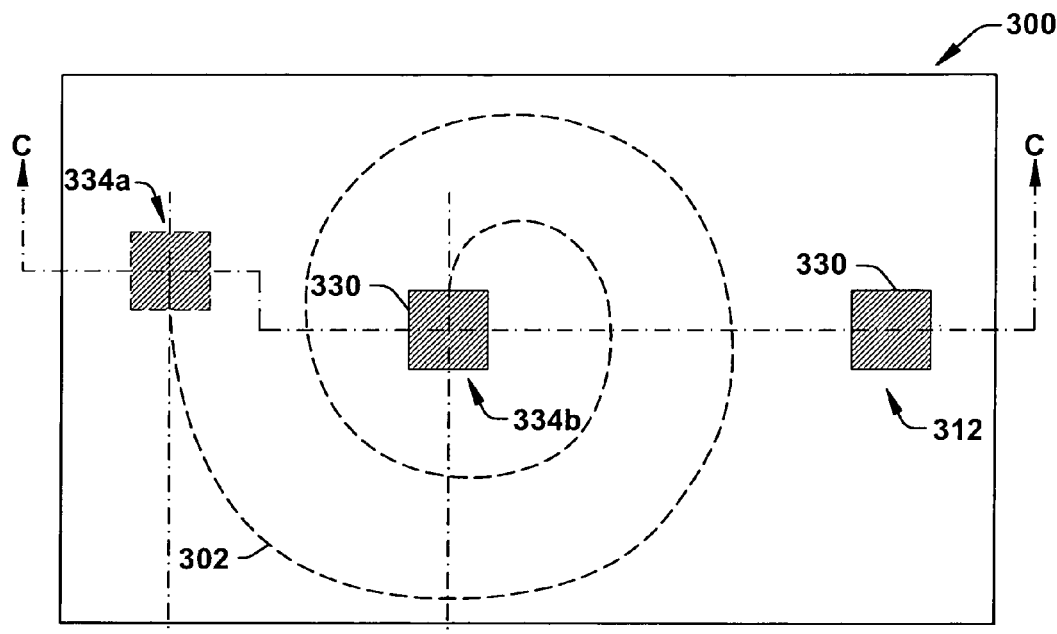
FIG. 3A is a simplified top view illustrating an exemplary integrated inductor structure having a two turn coil disposed within isolation layers of a semiconductor device in accordance with an aspect of the present invention.

FIG. 3A illustrates a top view of an exemplary integrated inductor structure L having a two turn coil disposed within isolation layers of a semiconductor device 300 in accordance with another aspect of the present invention.

Figure 3B:
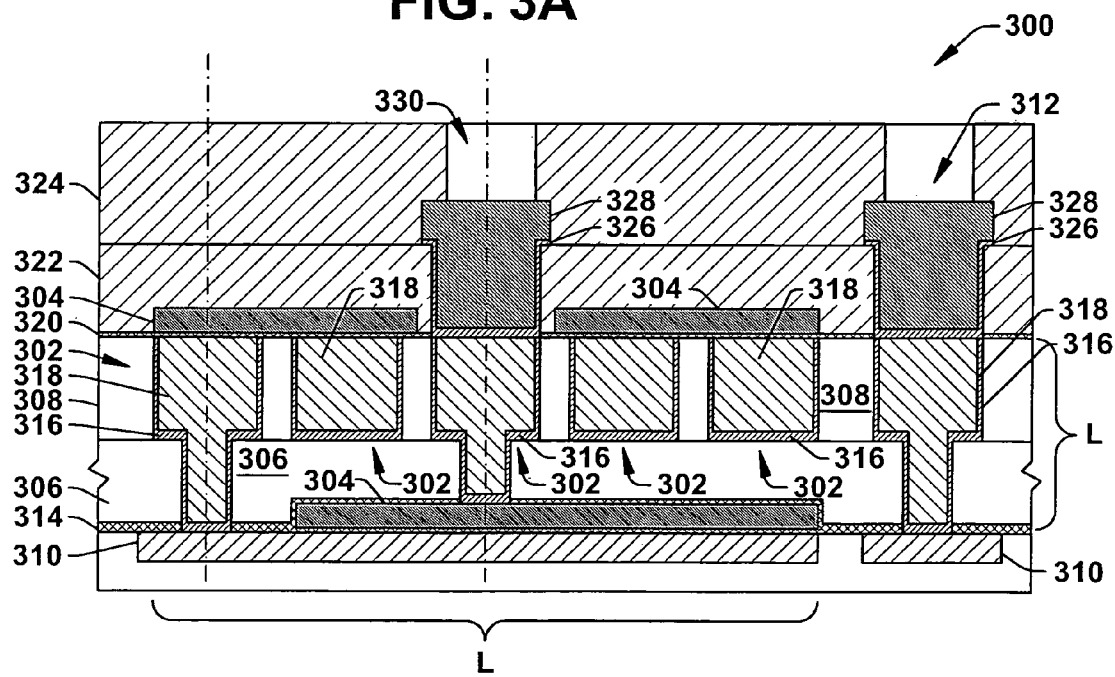
FIG. 3B is a cross-sectional side view taken along section line CC of FIG. 3A, illustrating an exemplary integrated inductor structure of the two turn coil connected to a lower ferromagnetic material core plate and an upper core plate disposed within isolation layers of the semiconductor device of FIG. 3A.

FIG. 3B is a cross-sectional side view taken along section line CC of FIG. 3A, illustrating the exemplary integrated inductor structure L of the semiconductor device 300 of FIG. 3A. The inductor structure L of device 300 of FIGS. 3A and 3B is similar to that of the inductor of device 200 FIGS. 2A and 2B, and as such need not be fully described again for the sake of brevity except where noted. In the semiconductor device 300, the inductor structure L comprises a two turn coil 302 connected to a lower ferromagnetic material core plate 304 and having an upper core plate 304 disposed within the isolation layers, for example, within interlevel dielectric layer ILD 306 (a first isolation layer) and the top inter-metal dielectric layer TOP IMD 308 (a second isolation layer) of the semiconductor device 300.

The inductor structure L of device 300, for example, is formed above a semiconductor substrate in or above the copper metal interconnect layers such as a copper Mx-1 layer 310, wherein bond pads for the inductor L and an unrelated via structure 312 are shown. An etch-stop layer 314 (e.g., TiN, Sic, SiC:N, or another etch stop material) may then be formed overlying the copper bond pads of the Mx-1 interconnect layer 310, followed by a core plate 304 comprising a conductive ferromagnetic material layer (e.g., cobalt, nickel, tantalum, a TiN/Co/TiN stack, a TaN/Co stack, or another high-permeability ferromagnetic core material). Each ferromagnetic core plate layer 304, for example, is patterned to form slots or other spaced apart traces in the conductive plate, which are mutually electrically conductive to each other in order to avoid eddy current losses in the plate.

Isolation layers ILD 306 and TOP IMD 308 formed over the lower core plate 304 and the etch stop layer 314, may comprise insulating materials (e.g., TaN, SiO2, an etch-stop material, SiN, SiC, SiC:H, or another insulating material). Trenches are then formed within the isolation layers 306 and 308, wherein a diffusion barrier layer 316 (e.g., TaN, TiN) and a conductive material layer 318 (e.g., copper, aluminum, tantalum, or a TaN/Al stack) is disposed within the trenches to form the inductor coil 302. In the present example, prior to the deposition of the diffusion barrier layer 316 and the conductive coil material layer 318, an opening for an interconnect is patterned through to the lower core plate 304 for connecting one end of the coil 302 to the lower core plate 304. In this way a series L-C circuit may be provided, wherein the lower plate 304 serves both as a capacitor plate and as a core to increase the inductance of the coil 302. Thereafter, the structure may then receive a CMP operation to further define the inductor coil 302 and to provide isolation spaces between the electrically conductive turns thereof.

Thus, an inductor coil comprising a conductive material is disposed and formed within the trenches of the second isolation layer 308 overlying the first isolation layer 306 and the core plate 304. Optionally, as shown, the formation of the inductor structure L may be followed by another deposition of an etch-stop material layer 320, a second or upper ferromagnetic core plate 304, and one or more protective overcoat layers, for example, protective overcoat layer PO 322, and protective overcoat layer PO2 324 (a third isolation layer) overlying the inductor coil 302 and the core plate 304.

Vias, such as 312 comprising additional diffusion barrier layers 326 and conductive interconnects 328 may be formed within the protective overcoat layers PO 322, and PO2 324 to interconnect to the underlying circuit elements and structures. Bond pads 330 may be then formed overlying the via structures or other openings for electrical connection to one or more terminals 334 of the inductor 302. In the exemplary device 300 of FIGS. 3A and 3B, one terminal 334a of the inductor coil 302 connects to the Mx-1 copper layer 310 under the inductor L, and the other terminal 334b connects to a bond pad 330 above inductor L.

Figure 4:
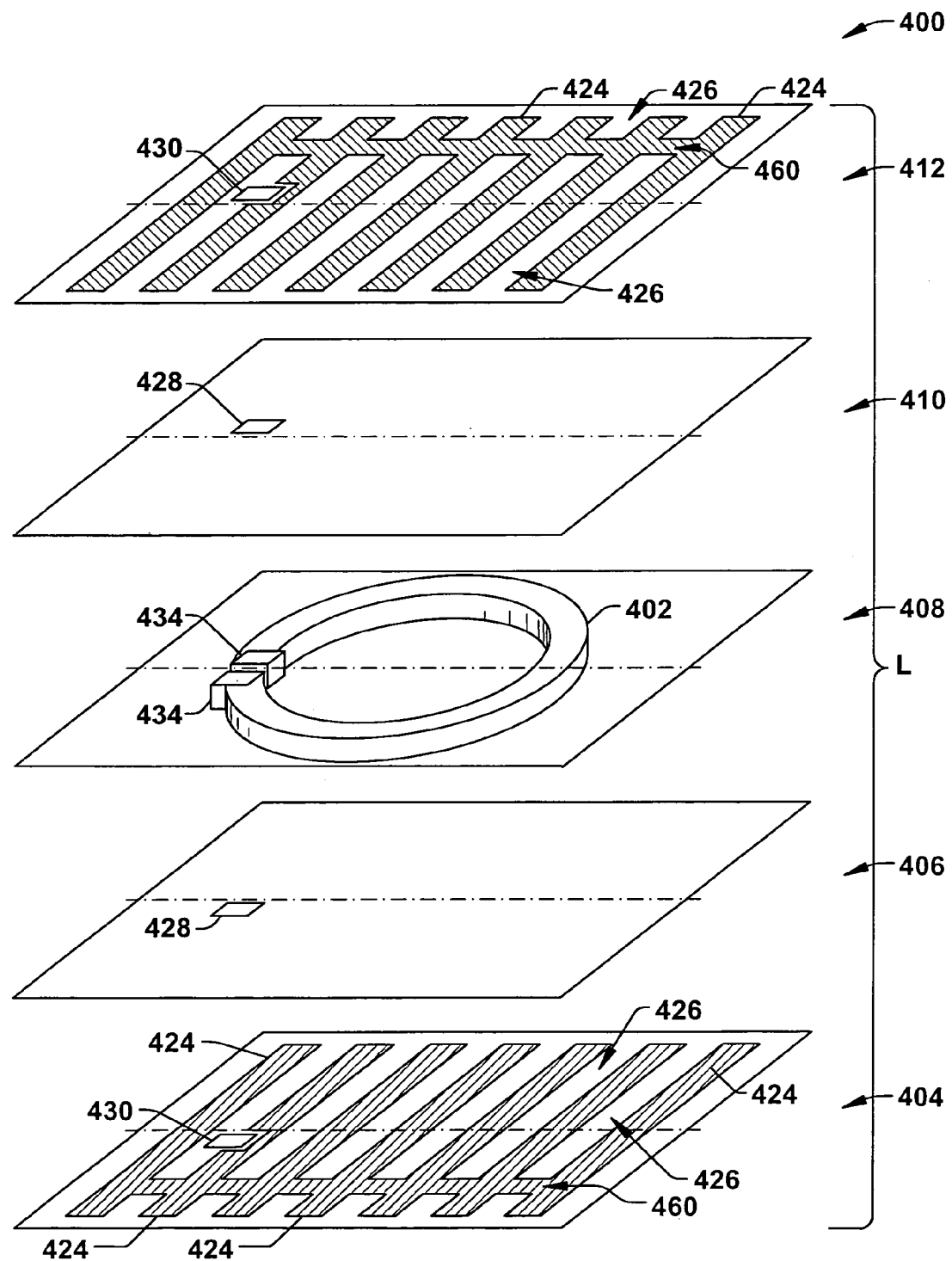
FIG. 4 is an exploded isometric view of an exemplary embodiment of the present invention illustrating an improved single turn inductor structure disposed between two isolation layers disposed between two conductive ferromagnetic core plates each core plate comprising a plurality of mutually electrically conductive spaced apart traces.

FIG. 4 illustrates an exploded isometric view of an exemplary embodiment of an improved single turn inductor device L 400 disposed between two isolation layers disposed between two conductive ferromagnetic core plates each core plate comprising a plurality of mutually electrically conductive spaced apart traces in accordance with the present invention. The exemplary inductor device 400 of FIG. 4 is fabricated with a structure similar to that of the single turn inductor of device 100 of FIGS. 1A and 1B, and as such need not be fully described again for the sake of brevity except where noted.

FIG. 4 illustrates additional details associated with the implementation of such integrated inductors, including various details of the single and two core plate implementations illustrated in the two turn devices 200 and 300 of FIGS. 2A, 2B, 3A, and 3B. Although the devices illustrated herein have included one and two turn inductor coils, it will be appreciated by those skilled in the art that inductor coils having any number of turns and having multiple layers of turns and multiple core plates (e.g., planar or contoured layer type core plates, which will be described infra) is anticipated in the context of the present invention.

Inductor device L 400, for example, provides an inductor coil 402 comprising one or more turns formed between one or more ferromagnetic core plates comprising a plurality of mutually electrically conductive spaced apart traces. As discussed, one or more of the core plates is suitable for use as a plate of a capacitor used in the integrated circuit. The inventors of the present invention has appreciated that even though the surface area of such "slotted" core plates and the corresponding permeability may actually decrease to some extent, the quality factor Q of the inductor device may be improved. The inventors realized that the use of solid conductive plates or layers often causes eddy currents to develop in the solid relatively large open areas thereof and result in added power consumption or eddy current losses.

In addition to these improvements, the inventor has appreciated that the use of these slotted plates have other peripheral benefits such as reduction of "dishing" during CMP processing relative to the use of larger continuous or solid conductive areas. Although the trace and slot widths have been illustrated as nearly equal for drawing purposes, the trace to slot width ratios may be adjusted as needed, and for example, be on the order of around 2 microns, which advantageously provide filtering of relatively high frequency EMI noise.

Inductor device L 400 comprises a lower or first core plate layer 404, a first isolation layer 406, a conductive layer 408 to form the inductor coil 402, a second isolation layer 410, and an upper or second core plate layer 412. The lower core plate layer 404 and upper core plate layer 412 comprise a conductive high-permeability ferromagnetic material, for example, cobalt that is sometimes used in the silicide process. Core plate layers 404 and 412 may further be formed as a plurality of conductive traces 424 and spaces or slots 426, wherein the plurality of traces 424 are mutually electrically conductive and spaced apart.

First isolation layer 406 and second isolation layer 410 (e.g., an insulative material, OSG, FSG, TEOS, a low-k dielectric material, or an ultra low-k dielectric material) provides isolation between the inductor coil 402 formed in the conductive layer 408 and the lower (first) core plate layer 404 or the upper (second) core plate layer 412. Conductive vias 428 formed in openings in the first isolation layer 406 and the second isolation layer 410 electrically connect between bond pads 430 and end terminals 434 of the inductor coil 402.

The conductive layer 408, disposed within and between the isolation layers 406 and 410, forms the inductor coil 402 of the inductor device L 400. The conductive layer 408 comprises, for example, copper, aluminum, tantalum, or a TaN/Al stack. The inductor coil 402 of the conductive layer 408 may be formed as one or more turns, and in one or more layers adequately spaced apart. In accordance with one aspect of the present invention, the traces 424 of first core plate layer 404 may, for example, be aligned with traces 424 of second core plate layer 412, or may be aligned orthogonal to each other.

Alternately, the upper isolation layer 410 may comprise an etch stop type layer (e.g., SiN, a hard mask or another etch-stop material layer, an insulative material layer) disposed overlying the conductive layer 408. Isolation layer 408 is generally designed as a relatively thin layer to maximize the mutual coupling between the upper core plate 412 and the inductor coil 402 and thus the inductance permeability.

Note, in the particular layout of the inductor L 400, a web 460 is used across the core plates 404 and 412 to electrically connect traces 424, such that they are mutually electrically conductive. Plate connections (not shown) may further be connected to the core plates 404 and 412 of inductor L 400 for external capacitor plate connections, for example.

Figure 5A:
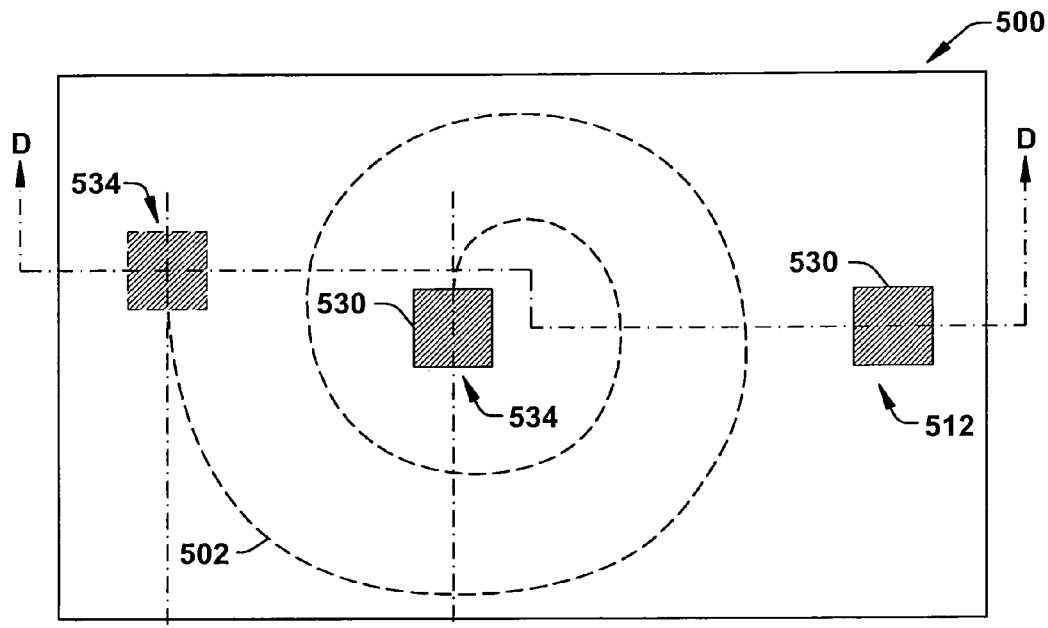
FIG. 5A is a simplified top view illustrating an exemplary integrated inductor structure having a two turn coil disposed within isolation layers of a semiconductor device in accordance with an aspect of the present invention.

FIG. 5A illustrates a simplified top view of an exemplary integrated inductor structure L having a two turn coil disposed within isolation layers of a semiconductor device 500 in accordance with another aspect of the present invention.

Figure 5B:
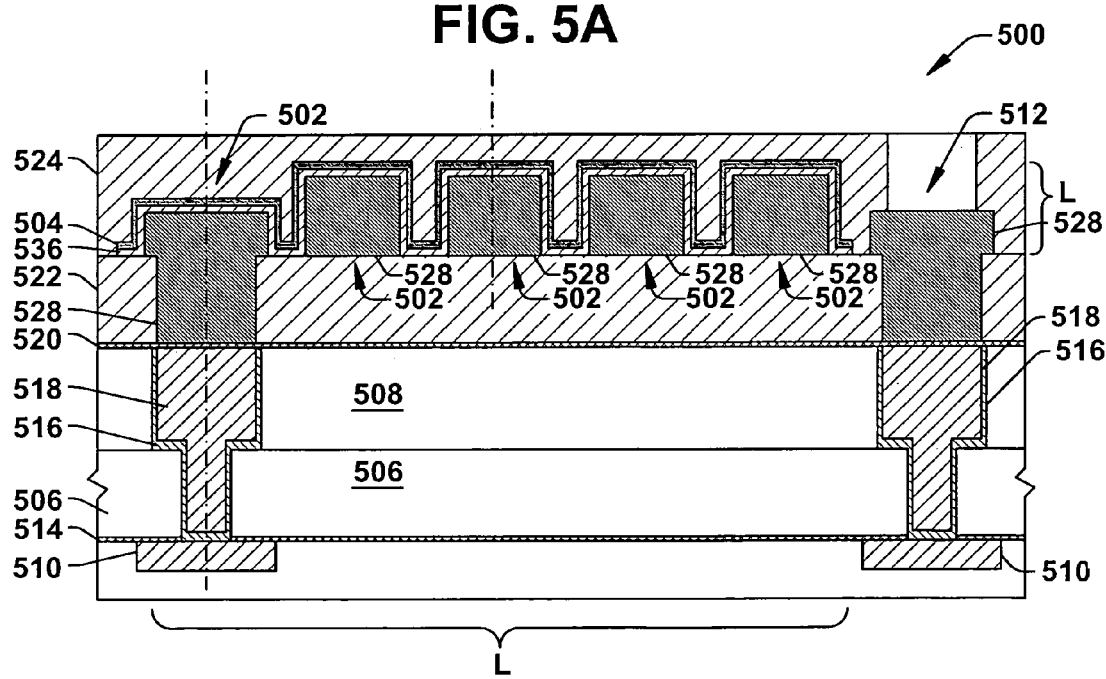
FIG. 5B is a cross-sectional side view taken along section line DD of FIG. 5A, illustrating an exemplary integrated inductor structure of the two turn coil and an overlying ferromagnetic material core plate layer disposed within a PO2 isolation layer of the semiconductor device of FIG. 5A.

FIG. 5B is a cross-sectional side view taken along section line DD of FIG. 5A, illustrating the exemplary integrated inductor structure L of the two turn coil and an overlying ferromagnetic material core plate layer disposed within a PO2 isolation layer of the semiconductor device 500 of FIG. 5A. In the semiconductor device 500, the inductor structure L comprises the two turn coil 502 and an overlying ferromagnetic material core plate layer 504 disposed together in a second protective overcoat isolation layer PO2 524 of the semiconductor device of FIG. 5A. Some of the lower layers illustrated in the present invention are similar to those previously described, and so may not be fully described again for the sake of brevity except where noted.

As before, the device 500 of the present implementation of the invention, for example, is formed above a semiconductor substrate above the copper metal interconnect layers such as a copper Mx-1 layer 510, wherein bond pads for the inductor L and an unrelated via structure 512 are shown. An etch-stop layer 514 (e.g., TiN, Sic, SiC:N, or another etch stop material) may then be formed overlying the copper bond pads of the Mx-1 interconnect layer 510. Isolation layers ILD 506 and TOP IMD 508 formed overlying the etch stop layer 514, may comprise insulating or dielectric materials (e.g., TaN, SiO2, an etch-stop material, SiN, SiC, SiC:H, or another insulating material).

Openings are then formed within the isolation layers 506 and 508, wherein a diffusion barrier layer 516 (e.g., TaN, TiN) and a conductive material layer 518 (e.g., copper, aluminum, or a TaN/Al stack) is disposed to form conductive vias connecting to the underlying metal interconnect layer 510. Another etch-stop material layer 520 may typically follow the interconnect via formation.

A first protective overcoat layer PO 522 is then formed overlying the etch stop layer 520 and the vias of the conductive material layer 518. Openings within the protective overcoat layer PO 522 and etch stop layer 520 are then provided wherein another conductive layer 528 (e.g., aluminum, tantalum, or a TaN/Al stack) is disposed. Conductive layer 528 is further patterned to form the inductor coil 502, while interconnect portions of conductive layer 528 are patterned to connect a bond pad 530 to one of a pair of end terminals 534 of the inductor coil 502, and from another of the end terminals 534 to the underlying metal layers such as interconnect layer 510.

In this implementation, an insulation layer (e.g., SiO$_2$) is then disposed overlying the inductor coil 502 formed by the conductive layer 528, followed by the core plate layer 504 comprising a conductive ferromagnetic material layer (e.g., cobalt, nickel, tantalum, a TiN/Co/TiN stack, a TaN/Co stack, or another high-permeability ferromagnetic core material). Again, although not shown, the ferromagnetic core plate layer 504 may be patterned similar to FIG. 4 to form slots or other spaced apart traces in the conductive plate 504, which are mutually electrically conductive to each other in order to avoid eddy current losses in the plate.

Optionally, as shown, the formation of the inductor structure L of device 500 may be followed by another protective overcoat layer, for example, protective overcoat layer PO2 524 (a third isolation layer) overlying the inductor coil 502 and the core plate layer 504. Thus, an inductor coil comprising a conductive material layer 528 (e.g., copper, aluminum, tantalum, or a TaN/Al stack) is disposed and formed together overlying the first protective overcoat layer PO 522. Note that the core plate 504 of the present implementation is essentially a contoured core plate 504 overlying the inductor coil turns, thereby potentially providing greater mutual coupling and a higher permeability to the inductor coil 502. Note that if the coil material 528 is copper, a diffusion barrier may be deposited prior to formation thereof, as may be appreciated.

Figure 6A:
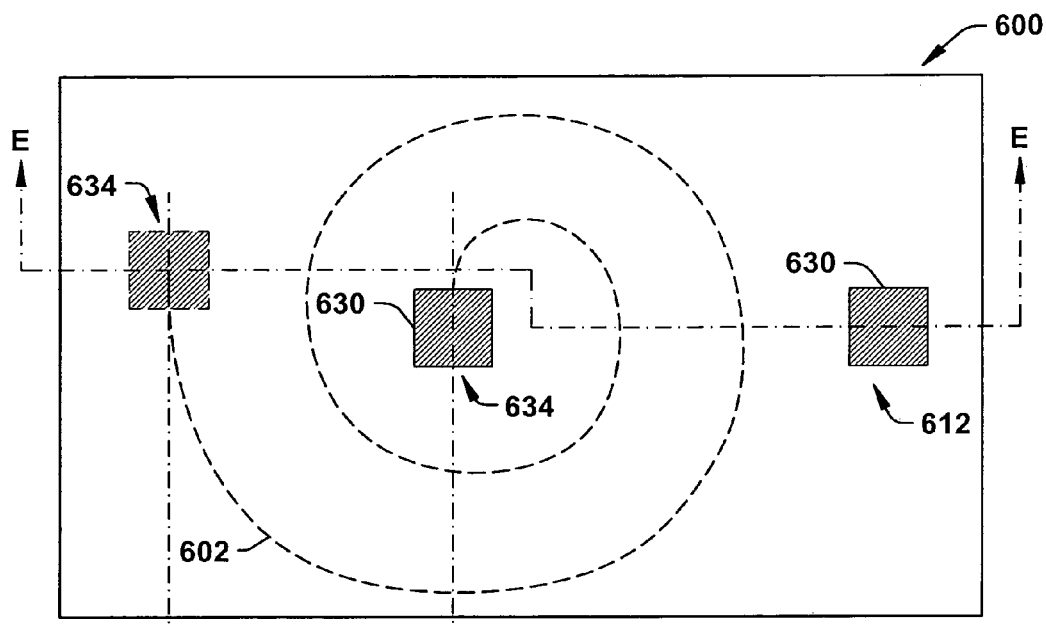
FIG. 6A is a simplified top view illustrating an exemplary integrated inductor structure having a two turn coil disposed within isolation layers of a semiconductor device in accordance with an aspect of the present invention.

FIG. 6A illustrates a simplified top view of an exemplary integrated inductor structure L having a two turn coil disposed within isolation layers of a semiconductor device 600 in accordance with still another aspect of the present invention.

Figure 6B:
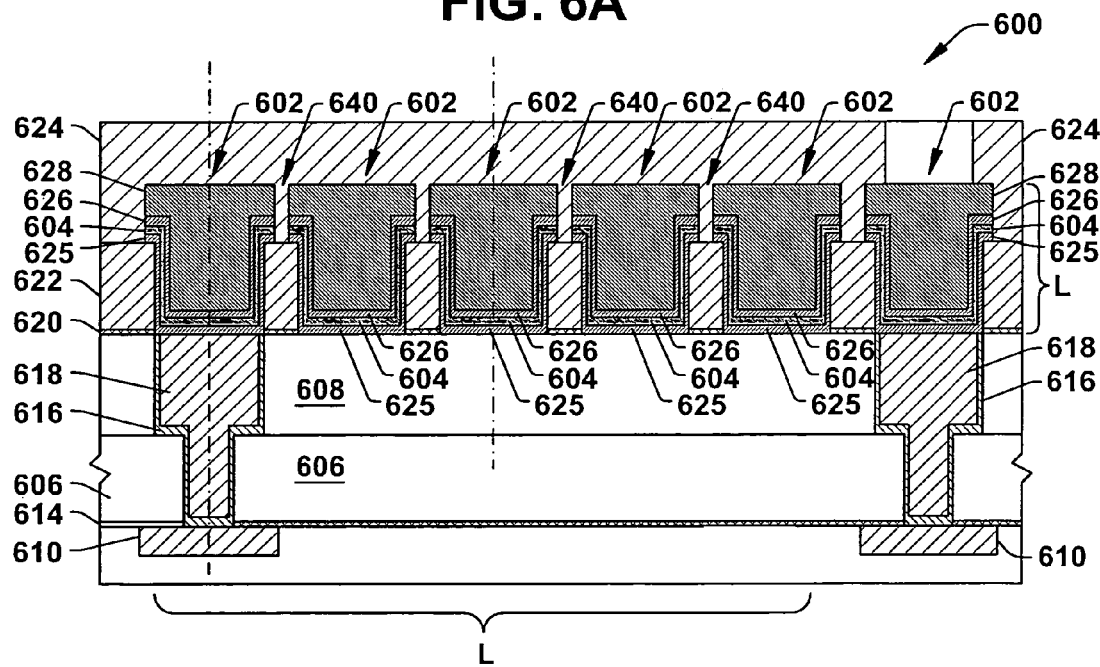
FIG. 6B is a cross-sectional side view taken along section line EE of FIG. 6A, illustrating an exemplary integrated inductor structure of the two turn coil overlying a ferromagnetic material core plate layer disposed together within a trench in the PO and PO2 isolation layers of the semiconductor device of FIG. 6A.

FIG. 6B illustrates a cross-sectional side view taken along section line EE of FIG. 6A, of the exemplary integrated inductor structure L of the two turn coil overlying a ferromagnetic material core plate layer disposed together within a trench in the PO and PO2 isolation layers of the semiconductor device 600 of FIG. 6A. The inductor structure L of device 600 of FIGS. 6A and 6B is similar to that of the inductor of device 500 FIGS. 5A and 5B, and as such need not be fully described again for the sake of brevity except where noted.

In particular, after the first protective overcoat layer PO 622 has been formed overlying the etch stop layer 620 and the vias of the conductive material layer 618, trenches and openings within the protective overcoat layer PO 622 and etch stop layer 620 are provided. Within these trenches and openings a diffusion barrier layer 625 (e.g., TaN, TiN) and a core plate layer 604 comprising a conductive ferromagnetic material layer (e.g., cobalt, nickel, tantalum, a TiN/Co/TiN stack, a TaN/Co stack, or another high-permeability ferromagnetic core material) is disposed.

Another diffusion barrier layer 626 (e.g., TaN, TiN) followed by a conductive layer 628 is further disposed within the trenches and opening to form the inductor coil 602. As before, interconnect portions of conductive layer 628 are patterned to connect a bond pad 630 to one of a pair of end terminals 634 of the inductor coil 602, and from another of the end terminals 634 to the underlying metal layers such as interconnect layer 610. The structure may then receive an etch and a CMP operation to further define the shape and turns of the inductor coil 602 and to provide isolation spaces 640 between the electrically conductive turns of the inductor coil 602 as well as the core plate layer 604.

Note in this implementation, unlike that of FIG. 4, the ferromagnetic core plate layer 604 is patterned by the etch process to form a single conductive core plate 604 along the length of the coil 602. In this way, a helical slot is formed along the length (and trace) of the core plate 604, thereby avoiding eddy current losses in a larger solid plate.

Optionally, as shown, the formation of the inductor structure L of device 600 may be followed by another protective overcoat layer, for example, protective overcoat layer PO2 624 (a third isolation layer) overlying the inductor coil 602 and the core plate layer 604. Thus, an inductor coil comprising a conductive material layer 628 (e.g., copper, aluminum, tantalum, or a TaN/Al stack) is disposed and formed together within the protective overcoat layers PO 622 and PO2 624. Again, note that the core plate 604 of the present implementation is essentially a contoured core plate 604 surrounding much of the inductor coil turns, thereby potentially providing greater mutual coupling and a higher permeability to the inductor coil 602.

Figure 7A:
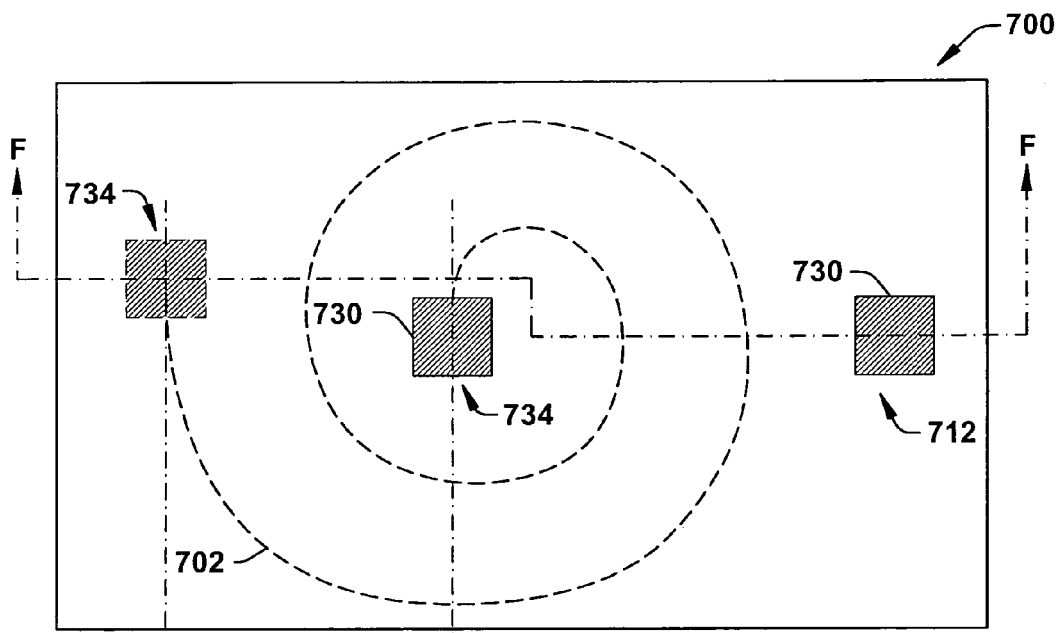
FIG. 7A is a simplified top view illustrating an exemplary integrated inductor structure having a two turn coil disposed within isolation layers of a semiconductor device in accordance with an aspect of the present invention.

FIG. 7A illustrates a simplified top view of an exemplary integrated inductor structure L having a two turn coil disposed within isolation layers of a semiconductor device 700 in accordance with yet another aspect of the present invention.

Figure 7B:
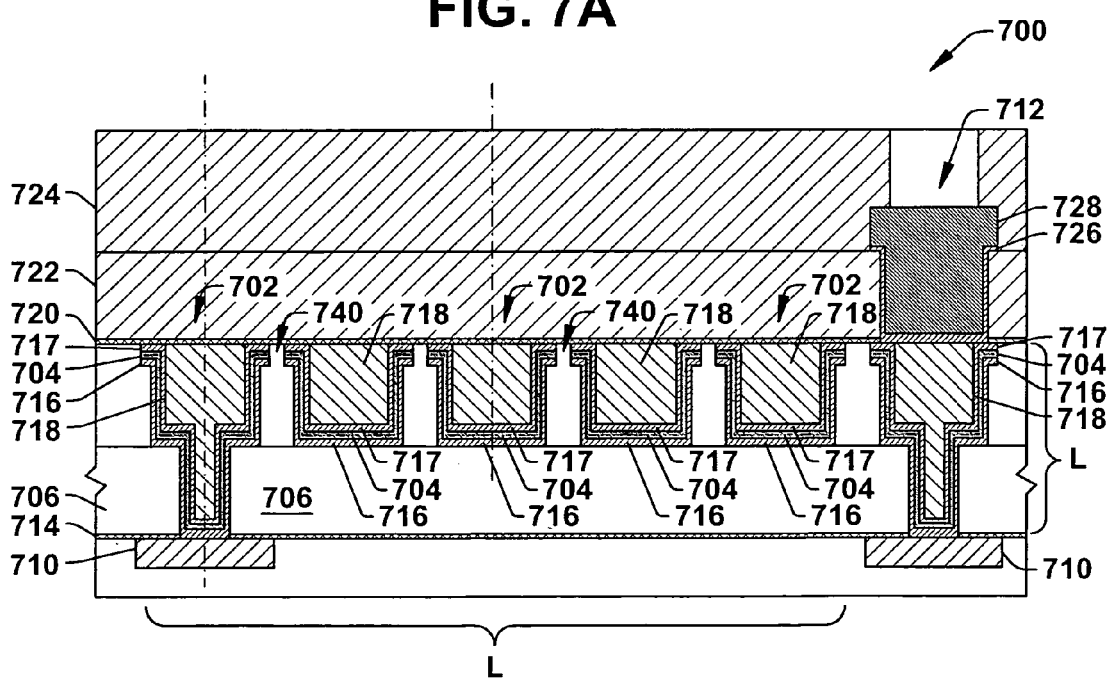
FIG. 7B is a cross-sectional side view taken along section line FF of FIG. 7A, illustrating an exemplary integrated inductor structure of the two turn coil overlying a ferromagnetic material core plate layer disposed together within a trench in the top IMD isolation layers of the semiconductor device of FIG. 7A.

FIG. 7B illustrates a cross-sectional side view taken along section line FF of FIG. 7A, of the exemplary integrated inductor structure L of the two turn coil overlying a ferromagnetic material core plate layer disposed together within a trench in the TOP IMD isolation layer of the semiconductor device 700 of FIG. 7A.

The inductor structure L of device 700 of FIGS. 7A and 7B is similar to portions of the inductor L of devices 500 of FIGS. 5A and 5B, and 600 of FIGS. 6A and 6B, and as such need not be fully described again for the sake of brevity except where noted.

As before, the device 700 of the present implementation, for example, is formed above a semiconductor substrate above the copper metal interconnect layers such as a copper Mx-1 layer 710, wherein bond pads for the inductor L and an unrelated via structure 712 are shown. An etch-stop layer 714 (e.g., TiN, Sic, SiC:N, or another etch stop material) may then be formed overlying the copper bond pads of the Mx-1 interconnect layer 710. Isolation layers ILD 706 and TOP IMD 708 formed overlying the etch stop layer 714, may comprise insulating or dielectric materials (e.g., TaN, SiO2, an etch-stop material, SiN, SiC, SiC:H, or another insulating material).

Openings are then formed within the isolation layer 706, while trenches and openings are formed in isolation layer 708. Within these trenches and openings a diffusion barrier layer 716 (e.g., TaN, TiN) and a core plate layer 704 comprising a conductive ferromagnetic material layer (e.g., cobalt, nickel, tantalum, a TiN/Co/TiN stack, a TaN/Co stack, or another high-permeability ferromagnetic core material) is disposed.

Another diffusion barrier layer 717 (e.g., TaN, TiN) and a conductive layer 718 (e.g., copper, aluminum, or a TaN/Al stack) is further disposed within the trenches and opening to form the inductor coil 702 and to form conductive vias connecting to the underlying metal interconnect layer 710. The structure may then receive an etch and a CMP operation to further define the shape and turns of the inductor coil 702 and to provide isolation spaces 740 between the electrically conductive turns of the inductor coil 702 as well as the core plate layer 704.

Note in this implementation, like that of FIGS. 6A and 6B, the ferromagnetic core plate layer 704 is patterned by the etch process to form a single conductive core plate 704 along the length of the coil 702. In this way, a helical slot may be formed along the length (and trace) of the core plate 704, thereby avoiding eddy current losses in a larger solid plate.

Another etch-stop material layer 720 is then formed overlying the inductor coil 702 and the interconnect vias. A first protective overcoat layer PO 722 is then formed overlying the etch stop layer 720. Openings within the protective overcoat layer PO 722 and etch stop layer 720 are then provided wherein another diffusion barrier layer 726 (e.g., TaN, TiN) and another conductive layer 728 (e.g., aluminum, tantalum, or a TaN/Al stack) is disposed. Interconnect portions of conductive layer 728 are patterned to connect a bond pad 730 to one of a pair of end terminals 734 of the inductor coil 702, and from another of the end terminals 734 to the underlying metal layers such as interconnect layer 710.

Optionally, as shown, the formation of the inductor structure L of device 700 may be followed by another protective overcoat layer, for example, protective overcoat layer PO2 724 (a third isolation layer). Thus, an inductor coil 702 comprising a conductive material layer 728 (e.g., copper, aluminum, tantalum, or a TaN/Al stack) is disposed and formed together within trenches in the TOP IMD layer 708. Thus, the integrated inductor L of the present invention provides more predictable inductor performance in a circuit, by mitigating eddy current losses, sufficiently shielding the device from noise, to limit power consumption in modern high-speed, high-density devices.

In the above discussion, the inductance of the coil is increased by use of a core plate material residing above or below the coil. In another alternative aspect of the present invention, a core plate may be employed on the same metallization layer as the coil and thus reside in the same insulating layer. For example, the dielectric layer may be deposited and patterned to form a first coil-shaped trench therein. A coil metal deposition may then be employed to fill the coil-shaped trench, followed by a planarization. A second set of vias or trenches may then be employed near the coil in a variety of differing patterns, as may be desired. A ferromagnetic material deposition is then performed, wherein the ferromagnetic material fills the second vias to form one or more core plates near the inductor coil for an improvement of the inductance thereof.

These and other aspects of the invention may be carried out in association with integrated inductor formation in any type of interconnect process, including but not limited to single and dual damascene processes. However, it is noted at this point that the invention is not limited to such specific applications, and further that the structures illustrated and described hereinafter are not necessarily drawn to scale.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An inductor structure formed in an integrated circuit, comprising:
   a first isolation layer;
   a first core plate comprising a plurality of substantially parallel discrete conductive traces, the plurality of parallel traces electrically coupled with a single conductive transverse web, the conductive traces comprising a conductive ferromagnetic material layer disposed over an upper surface of the first isolation layer;
   a second isolation layer overlying the first isolation layer; and
   an inductor coil comprising a conductive material layer formed within the second isolation layer;
   wherein the first core plate increases an inductance of the inductor coil.

2. The inductor structure of claim 1, wherein the conductive ferromagnetic material comprises one of cobalt, nickel, tantalum, a TiN/Co/TiN stack, a TaN/Co stack, and a high-permeability ferromagnetic core material.

3. The inductor structure of claim 1, further comprising:
   a third isolation layer formed over the inductor coil conductive layer; and
   a second core plate comprising a plurality of substantially parallel discrete conductive traces, the plurality of parallel traces electrically coupled with a single conductive transverse web, the conductive traces comprising a conductive ferromagnetic layer disposed over an upper surface of the third isolation layer, thereby providing a ferromagnetic core plate above and below the inductor coil.

4. The inductor structure of claim 3, wherein the conductive material layer of the inductor coil comprises one of copper, aluminum, tantalum, and a TaN/Al stack.

5. The inductor structure of claim 3, wherein at least one of the first and second core plates of the inductor further comprises a plate of a capacitor.

6. The inductor structure of claim 5, wherein one of the first and second core plates of the capacitor is electrically connected to the inductor coil.

7. The inductor structure of claim 3, wherein the traces of the first core plate of the inductor are aligned orthogonal to the traces of the second core plate.

8. The inductor structure of claim 1, wherein the material of at least one of the isolation layers comprises one of TaN, SiO2, an etch-stop material, SiN, SiC, SiC:H, and an insulative or dielectric material.

9. The inductor structure of claim 1 wherein the inductor coil is formed completely within the metal layers of the integrated circuit.

10. The inductor structure of claim 1, wherein the inductor coil is formed in one or more protective overcoat layers of the integrated circuit.

11. The inductor structure of claim 1, wherein the isolation layers comprise one of OSG, FSG, TEOS, a low-k dielectric material, and an ultra low-k dielectric material.

12. A method of forming an integrated inductor structure over a semiconductor substrate, comprising:
   providing a first isolation layer disposed over the semiconductor substrate;
   forming a first core plate comprising a plurality of substantially parallel discrete conductive traces, the plurality of parallel traces electrically coupled with a single conductive transverse web, the conductive traces comprising a conductive ferromagnetic material layer disposed over an upper surface of the first isolation layer;
   forming a second isolation layer over the first isolation layer and the first core plate; and
   forming an inductor coil comprising a conductive material layer disposed within trenches in the second isolation layer;
   wherein the first core plate increases an inductance of the inductor coil.

13. The method of claim 12, further comprising:
   forming a third isolation layer formed over the inductor coil conductive layer; and
   forming a second core plate comprising a plurality of substantially parallel discrete conductive traces, the plurality of parallel traces electrically coupled with a single conductive transverse web, the conductive traces comprising a conductive ferromagnetic layer disposed over an upper surface of the third isolation layer, thereby providing a ferromagnetic core plate above and below the inductor coil.

14. The method of claim 13, wherein at least one of the first and second core plates of the inductor further comprises a plate of a capacitor.

15. The method of claim 14, wherein the plate of the capacitor is electrically connected to the inductor coil.

16. The method of claim 13, wherein the traces of the first core plate of the inductor are aligned orthogonal to the traces of the second core plate.

17. The method of claim 12, wherein the inductor coil is formed completely within the metal layers of the integrated circuit.

18. The method of claim 12, wherein the inductor coil is formed in one or more protective overcoat layers of the integrated circuit.

* * * * *